United States Patent
Aho et al.

(10) Patent No.: US 11,688,996 B2
(45) Date of Patent: Jun. 27, 2023

(54) SEMICONDUCTOR MULTILAYER STRUCTURE

(71) Applicant: Tampere University Foundation sr., Tampere (FI)

(72) Inventors: Arto Aho, Lempäälä (FI); Riku Isoaho, Tampere (FI); Antti Tukiainen, Tampere (FI); Mircea Dorel Guina, Tampere (FI); Jukka Viheriälä, Lempäälä (FI)

(73) Assignee: Tampere University Foundation, sr., Tampere (FI)

( * ) Notice: Subject to any disclaimer, the term of this patent is extended or adjusted under 35 U.S.C. 154(b) by 365 days.

(21) Appl. No.: 16/648,171

(22) PCT Filed: Sep. 18, 2017

(86) PCT No.: PCT/EP2017/073521
§ 371 (c)(1),
(2) Date: Mar. 17, 2020

(87) PCT Pub. No.: WO2019/052672
PCT Pub. Date: Mar. 21, 2019

(65) Prior Publication Data
US 2020/0266610 A1 Aug. 20, 2020
US 2022/0021188 A2 Jan. 20, 2022

(51) Int. Cl.
*H01S 5/323* (2006.01)
*H01L 29/205* (2006.01)
(Continued)

(52) U.S. Cl.
CPC ........ *H01S 5/32316* (2013.01); *H01L 23/562* (2013.01); *H01L 29/205* (2013.01);
(Continued)

(58) Field of Classification Search
CPC ............. H01L 29/7786; H01L 29/7787; H01L 33/0025; H01S 5/125; H01S 5/32316; H01S 5/323–32391
See application file for complete search history.

(56) References Cited

U.S. PATENT DOCUMENTS 6,566,688 B1    5/2003   Zhang et al.
2007/0164311 A1 7/2007   von Kaenel et al.
(Continued)

FOREIGN PATENT DOCUMENTS

CA    3071711 A1    3/2019
CN    103794694 A   5/2014
(Continued)

OTHER PUBLICATIONS

Fischer, R "Growth and properties of GaAs/AlGaAs on nonpolar substrates using molecular beam epitaxy" Jour. of App. Phys. 58, 374 published online Jun. 4, 1998 (Year: 1998).*
(Continued)

*Primary Examiner* — Grant S Withers
(74) *Attorney, Agent, or Firm* — Cuenot, Forsythe & Kim, LLC

(57) ABSTRACT

A semiconductor device includes a substrate comprising a layer made of Ge and a semiconductor multilayer structure grown on the layer made of Ge. The semiconductor multilayer structure includes at least one first layer comprising a material selected from a group consisting of $Al_xGa_{1-x}As$, $Al_xGa_{1-x-y}In_yAs$, $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, $Al_xGa_{1-x-y}In_yAs_{1-z-c}N_zSb_c$, and $Al_xGa_{1-x-y}In_yAs_{1-z-c}P_zSb_c$, wherein for any material a sum of the contents of all group-III elements equals 1 and a sum of the contents of all group-V elements equals 1. The semiconductor multilayer structure also includes at least one second layer comprising a material selected from a group consisting of GaInAsNSb, GaInAsN,
(Continued)

AlGaInAsNSb, AlGaInAsN, GaAs, GaInAs, GaInAsSb, GaInNSb, GaInP, GaInPNSb, GaInPSb, GaInPN, AlInP, AlInPNSb, AlInPN, AlInPSb, AlGaInP, AlGaInPNSb, AlGaInPN, AlGaInPSb, GaInAsP, GaInAsPNSb, GaInAsPN, GaInAsPSb, GaAsP, GaAsPNSb, GaAsPN, GaAsPSb, AlGaInAs and AlGaAs.

10 Claims, 8 Drawing Sheets

(51) Int. Cl.
  H01L 29/778 (2006.01)
  H01L 23/00 (2006.01)
  H01S 5/02 (2006.01)
  H01S 5/125 (2006.01)
  H01S 5/32 (2006.01)
(52) U.S. Cl.
  CPC .......... H01L 29/7786 (2013.01); H01S 5/021 (2013.01); H01S 5/125 (2013.01); H01S 5/3201 (2013.01)

(56) References Cited

U.S. PATENT DOCUMENTS

| | | |
|---|---|---|
| 2007/0231488 A1 | 10/2007 | von Kaenel |
| 2008/0149915 A1 | 6/2008 | Mori et al. |
| 2017/0033261 A1 | 2/2017 | Kim et al. |

FOREIGN PATENT DOCUMENTS

| | | |
|---|---|---|
| CN | 111095578 A | 5/2020 |
| EP | 1513233 A1 | 5/2005 |
| EP | 1745165 A1 | 1/2007 |
| EP | 3685450 A1 | 7/2020 |
| JP | H05235485 A | 9/1993 |
| JP | 2004-221356 A | 8/2004 |
| JP | 2009-514252 A | 4/2009 |
| JP | 2010225981 A | 10/2010 |
| JP | 2020534704 A | 11/2020 |
| WO | 2005108654 A1 | 11/2005 |
| WO | 2007053686 A2 | 5/2007 |
| WO | 2019052672 A1 | 3/2019 |

OTHER PUBLICATIONS

Lee, A. "Coninuous-wave InAs/GaAs quantum-dot laser diodes monolithically grown on Si substrate with low threshold current densities" IET Optoelectronics May 2014 pp. 22181-22185 (Year: 2014).*

Takagi, S "Silicon-Germanium (SiGe) Nanostructures" excerpt 2011 (Year: 2011).*

Takamoto, T. "Multijunction solar cell Technologies—High efficiency, Radiation Resistance, and concentrator applications" 3rd World Conf. on Photo. Ene. Conv. Jun. 28, 2004 pp. 581-586 (Year: 2004).*

Bolkhovityanov, Y. "GaAs epitaxy on Si substrates: modern status of research and engineering" Pys-Usp. 51 (5) Aug. 2008 pp. 437-456 (Year: 2008).*

JP Patent Appln. No. 2020-537283, Office Action, Jun. 25, 2021, with Machine Translation, 15 pg.

Groenert, M.E. et al., "Monolithic integration of room-temperature cw GaAs/AlGaAs lasers on Si substrates via relaxed graded GeSi buffer layers," Journal of Applied Physics, vol. 93, No. 1, pp. 362-367.

WIPO Appln. No. PCT/EP2017/073521, International Search Report, dated Jan. 18, 2018, 4 pg.

WIPO Appln. No. PCT/EP2017/073521, Written Opinion, dated Jan. 18, 2018, 6 pg.

EP Patent Appln. No. 17772017.4, Office Action, dated Dec. 20, 2021, 6 pg.

JP Appln 2020-537283, Office Action, dated Mar. 7, 2022, 6 pg.

* cited by examiner

US 11,688,996 B2

SEMICONDUCTOR MULTILAYER STRUCTURE

CROSS-REFERENCE TO RELATED APPLICATIONS

This application claims the benefit of WIPO Application Number PCT/EP2017/073521 filed on Sep. 18, 2017, which is fully incorporated herein by reference.

BACKGROUND

The present disclosure relates to a semiconductor device. Gallium arsenide (GaAs) based structures with inactive layers of a GaAs-based material are a versatile approach for fabrication of optoelectronic devices such as edge emitting lasers (EEL), vertical external cavity surface emitting lasers (VECSEL), vertical cavity surface emitting lasers (VCSEL), solar cells (SC), detectors, light emitting diodes (LED), semiconductor optical amplifiers (SOA), saturable absorber mirrors (SESAM).

SUMMARY

A semiconductor device includes a substrate comprising a layer made of Ge and a semiconductor multilayer structure. The semiconductor multilayer structure includes at least one first layer comprising a material selected from a group consisting of $Al_xGa_{1-x}As$, wherein x is approximately 0.6, $Al_xGa_{1-x-y}In_yAs$, wherein $0 \leq x \leq 0.6$ and $0 \leq y \leq 0.02$, $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 \leq x \leq 1$, $0 \leq y \leq 1$, $0 \leq z \leq 0.3$, and $0 \leq c \leq 1$, $Al_xGa_{1-x-y}In_yAs_{1-z-c}N_zSb_c$, wherein $0 \leq x \leq 1$, $0 \leq y \leq 1$, $0 \leq z \leq 0.3$, and $0 \leq c \leq 0.7$, and $Al_xGa_{1-x-y}In_yAs_{1-z-c}P_zSb_c$, wherein $0 \leq x \leq 1$, $0 \leq y \leq 1$, $0 \leq z \leq 1$, and $0 \leq c \leq 0.3$, wherein for any material a sum of the contents of all group-III elements equals 1 and a sum of the contents of all group-V elements equals 1. The semiconductor multilayer structure also includes at least one second layer comprising a material selected from a group consisting of GaInAsNSb, GaInAsN, AlGaInAsNSb, AlGaInAsN, GaAs, GaInAs, GaInAsSb, GaInNSb, GaInP, GaInPNSb, GaInPSb, GaInPN, AlInP, AlInPNSb, AlInPN, AlInPSb, AlGaInP, AlGaInPNSb, AlGaInPN, AlGaInPSb, GaInAsP, GaInAsPNSb, GaInAsPN, GaInAsPSb, GaAsP, GaAsPNSb, GaAsPN, GaAsPSb, AlGaInAs and AlGaAs, wherein for any material a sum of the contents of all group-III elements equals 1 and a sum of the contents of all group-V elements equals 1. The semiconductor multilayer structure is grown on the layer made of Ge.

DETAILED DESCRIPTION

Figure 1:
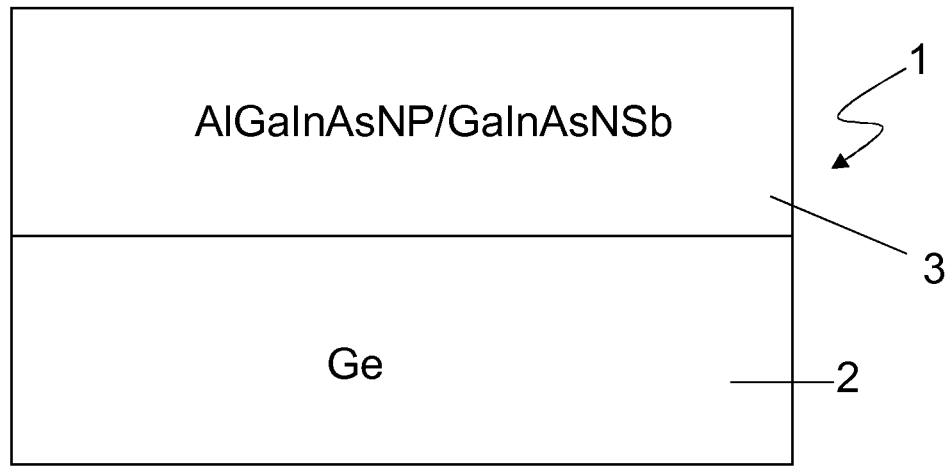
FIG. 1 is a schematic cross-sectional view of an embodiment of an optoelectronic semiconductor device according to the present disclosure.

The present disclosure relates to a semiconductor device comprising a semiconductor multilayer structure including at least one first layer consisting of a material selected from a group consisting of $Al_xGa_{1-x}As$, wherein x is approximately 0.6, $Al_xGa_{1-x-y}In_yAs$, wherein $0 \leq x \leq 0.6$ and $0 \leq y \leq 0.02$, $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 \leq x \leq 1$, $0 \leq y \leq 1$, $0 \leq z \leq 0.3$, and $0 \leq c \leq 1$, $Al_xGa_{1-x-y}In_yAs_{1-z-c}N_zSb_c$, wherein $0 \leq x \leq 1$, $0 \leq y \leq 1$, $0 \leq z \leq 0.3$, and $0 \leq c \leq 0.7$, and $Al_xGa_{1-x-y}In_yAs_{1-z-c}P_zSb_c$, wherein $0 \leq x \leq 1$, $0 \leq y \leq 1$, $0 \leq z \leq 1$, and $0 \leq c \leq 0.3$, wherein for any material a sum of the contents of all group-III elements equals 1 and a sum of the contents of all group-V elements equals 1, and at least one second layer consisting of a material chosen from a group consisting of GaInAsNSb, GaInAsN, AlGaInAsNSb, AlGaInAsN, GaAs, GaInAs, GaInAsSb, GaInNSb, GaInP, GaInPNSb, GaInPSb, GaInPN, AlInP, AlInPNSb, AlInPN, AlInPSb, AlGaInP, AlGaInPNSb, AlGaInPN, AlGaInPSb, GaInAsP, GaInAsPNSb, GaInAsPN, GaInAsPSb, GaAsP, GaAsPNSb, GaAsPN, GaAsPSb, AlGaInAs and AlGaAs, wherein for any material a sum of the contents of all group-III elements equals 1 and a sum of the contents of all group-V elements equals 1.

Gallium arsenide (GaAs) based structures with inactive layers of a GaAs-based material are a versatile approach for fabrication of optoelectronic devices such as edge emitting lasers (EEL), vertical external cavity surface emitting lasers (VECSEL), vertical cavity surface emitting lasers (VCSEL), solar cells (SC), detectors, light emitting diodes (LED), semiconductor optical amplifiers (SOA), saturable absorber mirrors (SESAM). Furthermore, gallium arsenide (GaAs) based structures with at least one layer of an AlGaAs material or of a GaAs material are an approach for fabrication of fast transistors.

When semiconductor multilayer structures with inactive layers based on an AlGaAs material are fabricated on GaAs substrates the AlGaAs layers are not lattice matched and build-up compressive strain to the structure when the layer thicknesses are increased. The higher the composition x of Al is, and the thicker the AlGaAs layers are, the larger the nominal strain for the structure will be.

Based on experimental results and on critical thickness calculations, the operation lifetime of optoelectronic components is strongly dependent on the total strain in the structure. Accumulation of strain can also lead to strain relaxation during crystal growth in the form of misfit dislocations. Misfit dislocation formation will lead to inferior device performance. Longer device lifetimes and higher laser output powers can be achieved without misfit dislocations. Excessive strain can already accumulate while fabricating thick layer structures on GaAs containing $Al_xGa_{1-x}As$ with x=0.6. Such layers are typically used as cladding layers of the active multilayer structures, leading to reduced lifetimes of the semiconductor devices.

Thus, there is a need to provide semiconductor multilayer structures including at least one layer based on a GaAs material and at least one layer of a further material avoiding or at least reducing build-up of compressive strain.

It would be desirable to integrate optoelectronic or photonic devices in or on microelectronic devices like integrated circuits. However, for example, optoelectronic devices operating at a wavelength of 1.3 μm of the electromagnetic radiation to be processed require inactive layers based on an AlGaAs material. However, AlGaAs materials as such cannot be grown with required quality directly on Si substrates.

Consequently, there is a need for semiconductor multilayer structures based on group-III elements and group-V elements grown on Si substrates, Ge substrates or SiGe substrates in order to provide an integration of Si based microelectronics and optoelectronic devices based on group-III elements and group-V elements.

Further, there is a need for the integration of fast transistors on Si substrates, Ge substrates or SiGe substrates.

At least one of the above objects is solved by a semiconductor device according to claim 1.

In an embodiment, the semiconductor multilayer structure is an optoelectronic semiconductor multilayer structure including a plurality of the first layers forming inactive layers and a plurality of the second layers forming active layers.

Surprisingly, it was found that growth of a semiconductor multilayer structure with at least one first layer consisting of a material chosen from a group consisting of $Al_xGa_{1-x}As$, wherein x is approximately 0.6, $Al_xGa_{1-x-y}In_yAs$, wherein $0 \leq x \leq 0.6$ and $0 \leq y \leq 0.02$, $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 \leq x \leq 1$, $0 \leq y \leq 1$, $0 \leq z \leq 0.3$, and $0 \leq c \leq 1$, $Al_xGa_{1-x-y}In_yAs_{1-z-c}N_zSb_c$, wherein $0 \leq x \leq 1$, $0 \leq y \leq 1$, $0 \leq z \leq 0.3$, and $0 \leq c \leq 0.7$, and $Al_xGa_{1-x-y}In_yAs_{1-z-c}P_zSb_c$, wherein $0 \leq x \leq 1$, $0 \leq y \leq 1$, $0 \leq z \leq 1$, and $0 \leq c \leq 0.3$, wherein for any material a sum of the contents of all group-III elements equals 1 and a sum of the contents of all group-V elements equals 1, and at least one second layer consisting of a material selected from a group consisting of GaInAsNSb, GaInAsN, AlGaInAsNSb, AlGaInAsN, GaAs, GaInAs, GaInAsSb, GaInNSb, GaInP, GaInPNSb, GaInPSb, GaInPN, AlInP, AlInPNSb, AlInPN, AlInPSb, AlGaInP, AlGaInPNSb, AlGaInPN, AlGaInPSb, GaInAsP, GaInAsPNSb, GaInAsPN, GaInAsPSb, GaAsP, GaAsPNSb, GaAsPN, GaAsPSb, AlGaInAs and AlGaAs, wherein for any material a sum of the contents of all group-III elements equals 1 and a sum of the contents of all group-V elements equals 1, on a Ge layer of the substrate is possible.

Further it has turned out that this particular combination of materials avoids accumulative build-up of compressive strain in the structure. Reduction of the build-up of compressive strain in the semiconductor multilayer structure substantially increases the expected operation lifetime of the semiconductor device.

In an embodiment of the present disclosure, the semiconductor multilayer structure forms an active optoelectronic device. In an embodiment the active optoelectronic device is operating at single or multiple wavelengths between 0.54 μm and 1.7 μm for the electromagnetic radiation to be generated, detected or generally speaking processed. In an embodiment the active optoelectronic device operates at a wavelength of 1.3 μm.

There are multiple approaches in order to reduce the lattice mismatch between any of the at least one first layer, such as a plurality of inactive layers in case of an optoelectronic semiconductor multilayer structure.

In an embodiment of the disclosure at least one of the first layers of the semiconductor multilayer structure consists of a material selected from a group consisting of $Al_xGa_{1-x}As$, wherein x is approximately 0.6, $Al_xGa_{1-x-y}In_yAs$, wherein $0 < x \leq 0.6$ and $0 < y \leq 0.02$, $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 < x \leq 1$, $0 < y \leq 1$, $0 < z \leq 0.3$, and $0 < c \leq 1$, $Al_xGa_{1-x-y}In_yAs_{1-z-c}N_zSb_c$, wherein $0 < x \leq 1$, $0 < y \leq 1$, $0 < z \leq 0.3$, and $0 < c \leq 0.7$ and $Al_xGa_{1-x-y}In_yAs_{1-z-c}P_zSb_c$, wherein $0 < x \leq 1$, $0 < y \leq 1$, $0 < z \leq 1$, and $0 < c \leq 0.3$.

In a further embodiment the first layer of the semiconductor multilayer structure consists of a $Al_xGa_{1-x}As$ material which is chosen dependent on the Al composition x, wherein once x is approximately 0.6 the material is $Al_xGa_{1-x}As$, once $0 \leq x \leq 0.6$ the material is $Al_xGa_{1-x-y}In_yAs$, wherein $0 \leq y \leq 0.02$ or once $x > 0.6$ the material is selected from a group consisting of $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 \leq y \leq 0.02$, $0 \leq z \leq 0.3$, and $0 \leq c \leq 1$.

In yet another embodiment the first layer of the semiconductor multilayer structure consists of a $Al_xGa_{1-x}As$ material which is chosen dependent on the Al composition x, wherein once x is approximately 0.6 the material is $Al_xGa_{1-x}As$, once $0 \leq x \leq 0.6$ the material is $Al_xGa_{1-x-y}In_yAs$, wherein $0 < y \leq 0.02$ or once $x > 0.6$ the material is selected from a group consisting of $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 < y \leq 0.02$, $0 < z \leq 0.3$, and $0 < c \leq 1$.

Each of the above $Al_xGa_{1-x}As$ materials which could be used as the material of a plurality of the inactive layers has a considerably low lattice mismatch relatively to the Ge layer of the substrate.

In an embodiment at least one the first layers of the semiconductor multilayer structure, such as any of the inactive layers of an optoelectronic semiconductor multilayer structure, has a lattice constant, which differs from the lattice constant of the Ge layer of the substrate by less than the difference between the lattice constant of GaAs and the lattice constant of Ge.

In an embodiment any of the first layers or any of the second layers of the semiconductor multilayer structure may be doped or undoped. Any of the layers may have an n-type or a p-type doping to provide n-type or p-type conductivity or it may be undoped. Examples for dopant elements are Si, Se, Sn, S, Te, Be, C, Mg, Ge and Zn.

In an embodiment of the present disclosure the substrate comprises either a layer of silicon (Si), a layer of silicon-germanium (SiGe), a second layer of germanium (Ge) or a plurality of layers consisting of a material chosen from a group consisting of Si, SiGe and Ge, wherein the Ge layer is grown on the Si layer, or on the SiGe layer or on the second Ge layer or on the plurality of layers consisting of a material chosen from a group consisting of Si, SiGe and Ge.

In a further embodiment of the present disclosure the Ge layer of the substrate is strain relaxed and the Ge layer is grown in direct contact with the Si layer, SiGe layer or the second Ge layer of the substrate.

In a further alternative embodiment the Ge layer of the substrate is compressively strained with respect to a further layer of the substrate consisting of a material chosen from a group consisting of Si, SiGe and Ge and the substrate further comprises a strain compensation layer, wherein the strain compensation layer is grown in direct contact with the Ge layer between the Ge layer and the semiconductor multilayer structure.

In an embodiment the strain compensation layer consists of a material selected from a group consisting of Si, SiGe, AlP, GaP, GaInP, AlInP, GaAsP, GaInAsP, GaNAsP, GaAsN, GaInAsN, GaInNP and AlGaInAsP.

For a compressively strained Ge layer of the substrate on a Si or a SiGe layer of the substrate a strain compensation layer is needed between the Ge layer of the substrate and the layers of the semiconductor multilayer structure. In this case it may be required to add N or P or both to the material of at least one if first layer, such as the plurality of inactive layers, in order to match the lattice constant of the first layers, such as the plurality of inactive layers of an optoelectronic multilayer structure, to the lattice constant of the strained Ge layer of the substrate. In a particular embodiment the material of the at least one first layer of the semiconductor multilayer structure, such as a plurality of the inactive layers of an optoelectronic multilayer structure, on a compressively strained Ge layer of the substrate is chosen from a group consisting of AlGaInAsNPSb-based materials.

The semiconductor device according to the present disclosure allows growth of semiconductor multilayer structures on substrates comprising at least one layer consisting of a material chosen from a group consisting of Si, SiGe, and Ge.

In principle a Si based substrate allows to reduce manufacturing prices. Furthermore, in an embodiment of the present disclosure a Si, SiGe or Ge based substrate allows to integrate microelectronic circuits such as microprocessors, memory chips and logical components, on the same substrate as the semiconductor device.

In an embodiment the substrate comprises a layer consisting of a material chosen from a group consisting of Si, SiGe and Ge, wherein the Ge layer of the substrate is grown on the layer consisting of a material chosen from the group consisting of Si, SiGe and Ge and a microelectronic device is manufactured on the layer consisting of a material chosen from the group consisting of Si, SiGe and Ge.

In an embodiment the optoelectronic semiconductor multilayer structure is a heterostructure forming a laser gain structure.

In another embodiment the optoelectronic semiconductor multilayer structure comprises an active semiconductor device with a distributed Bragg reflector (DBR) having a plurality of layers of an AlGaAs-based material.

In another embodiment the semiconductor multilayer structure comprises a transistor.

Further advantages, features and applications of the present disclosure become apparent from the following description of embodiments thereof as well as from the respective figures.

The schematic cross-sectional views of FIGS. 1 to 4 show the principle design of semiconductor devices according to embodiments of the present disclosure.

All the semiconductor devices 1, 10, 20, 30 of FIGS. 1 to 6 and 10 have a substrate with a Ge layer 2, 3. Other than for example GaAs, the semiconductor multilayer structures of selected III-V materials according to the present disclosure can be grown on Ge without a substantial buildup of compressive strain.

Surprisingly, it hast turned out that optoelectronic semiconductor multilayer structures comprising a plurality of second layers forming the active layers consisting of a material chosen from a group consisting of GaInAsNSb, GaInAsN, AlGaInAsNSb, AlGaInAsN, GaAs, GaInAs, GaInAsSb, GaInNSb, GaInP, GaInPNSb, GaInPSb, GaInPN, AlInP, AlInPNSb, AlInPN, AlInPSb, AlGaInP, AlGaInPNSb, AlGaInPN, AlGaInPSb, GaInAsP, GaInAsPNSb, GaI-nAsPN, GaInAsPSb, GaAsP, GaAsPNSb, GaAsPN, GaAsPSb AlGaInAs and AlGaAs, wherein for any material a sum of the contents of all group-III elements equals 1 and a sum of the contents of all group-V elements equals 1, as well as a plurality of inactive layers consisting of a material chosen from a group consisting of $Al_xGa_{1-x}As$, wherein x is approximately 0.6, $Al_xGa_{1-x-y}In_yAs$, wherein $0 \le x \le 0.6$ and $0 \le y \le 0.02$, $Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 \le x \le 1$, $0 \le y \le 1$, $0 \le z \le 0.3$, and $0 \le c \le 1$, $Al_xGa_{1-x-y}In_yAs_{1-z-c}N_zSb_c$, wherein $0 \le x \le 1$, $0 \le y \le 1$, $0 \le z \le 0.3$, and $0 \le c \le 0.7$, and $Al_xGa_{1-x-y}In_yAs_{1-z-c}P_zSb_c$, wherein $0 \le x \le 1$, $0 \le y \le 1$, $0 \le z \le 1$, and $0 \le c \le 0.3$, wherein for any material a sum of the contents of all group-III elements equals 1 and a sum of the contents of all group-V elements equals 1, can be grown on the Ge layer 2 to form an active optoelectronic device operating effectively at wavelengths in the range between 0.54 µm and 1.7 µm wavelengths of the electromagnetic radiation.

Figure 2:
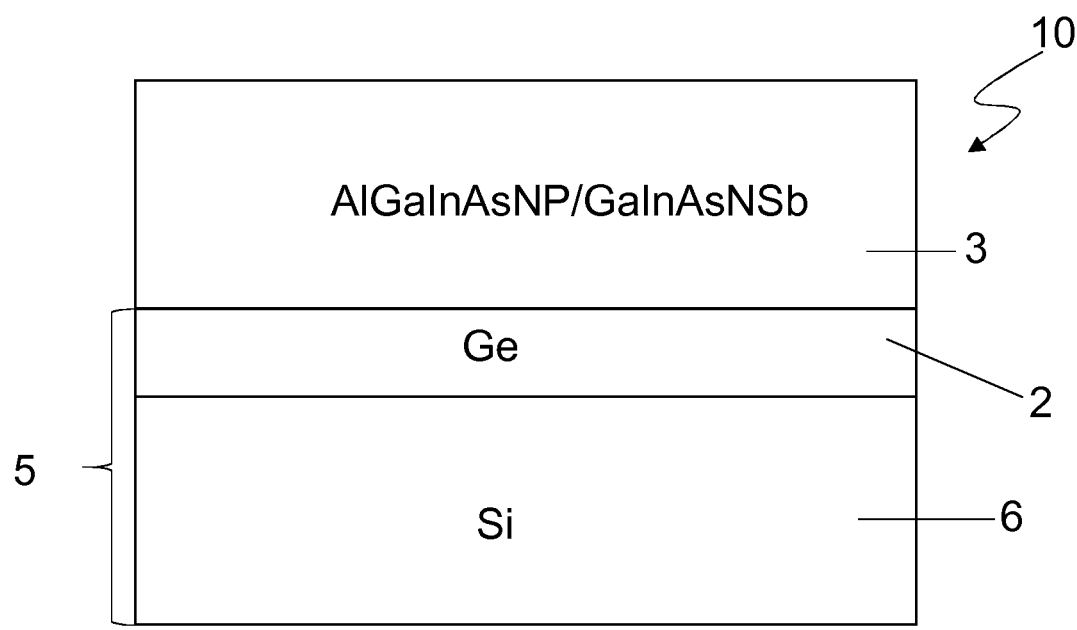
FIG. 2 is a schematic cross-sectional view of an alternative embodiment of an optoelectronic semiconductor device according to the present disclosure.
Figure 3:
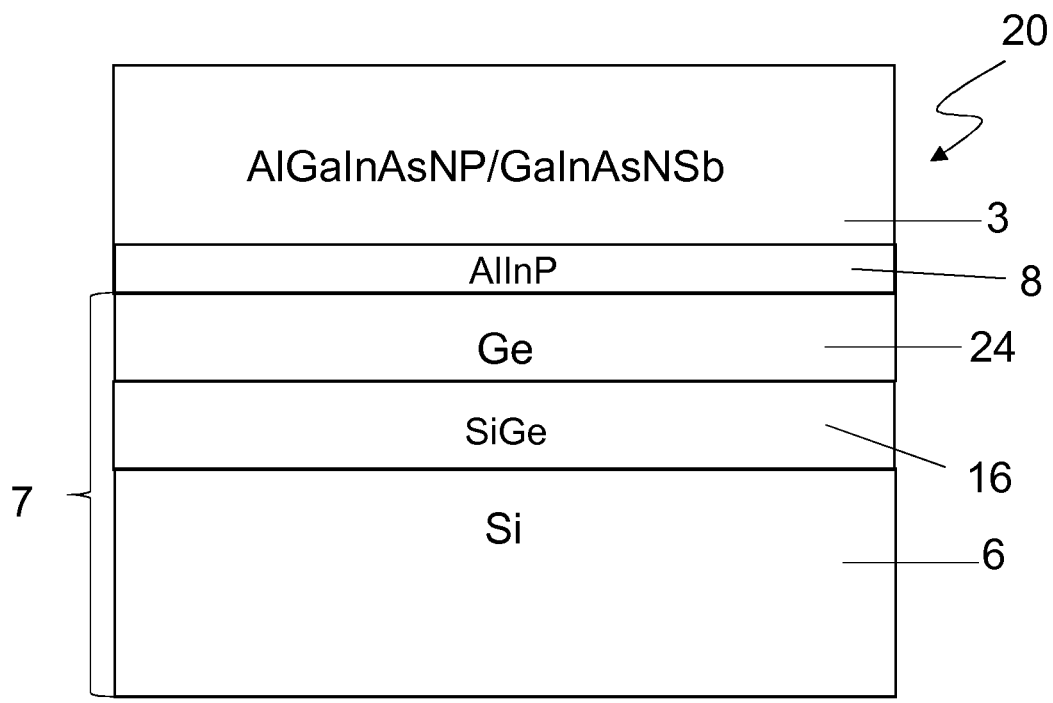
FIG. 3 is a schematic cross-sectional view of yet another embodiment of an optoelectronic semiconductor device according to the present disclosure.

In the example of FIGS. 1 to 3 the semiconductor multilayer structure 3 is a laser structure comprising a plurality of active layers consisting of GaInAsNSb and a plurality of inactive layers consisting of AlGaInAsNP.

None of the inactive layers of the multilayer structures 3, of FIGS. 1 to 3 has a lattice constant which differs from the lattice constant of the underlying Ge layer 2, 3 by more than the difference between the lattice constant of GaAs and the lattice constant of Ge.

The embodiments of FIGS. 1 and 2 differ with respect to the particular choice of their substrates 2, 5.

In the embodiment of FIG. 1 the substrate consists of a Ge layer 2, only. In contrast, the substrate 5 of the embodiment of FIG. 2 consists of a Ge layer 2 as well as a Si layer 6.

In the embodiment of FIG. 2 the Ge layer is a strain relaxed Ge layer directly grown on the Si layer 6. The semiconductor multilayer structure 4 in turn is directly grown on the relaxed Ge layer 2.

The embodiment of FIG. 2 has the advantage that the Si layer 6 of the substrate 5 can be used as a substrate for a microelectronic device on the same substrate 5 which supports the optoelectronic semiconductor multilayer structure 4.

In alternative embodiments not depicted in the figures, the Si layer 6 of the substrate 5 of FIG. 2 could be replaced by a layer consisting of Ge or SiGe.

The semiconductor device 20 of FIG. 3 mainly differs from the embodiment of FIG. 2 by the particular choice of its substrate 7. In this embodiment the Ge layer 24 is not strain relaxed, but has a high residual compressive strain and thus a smaller lateral lattice constant than the strain relaxed Ge layer 2 of FIGS. 1 and 2.

In order to be able to still grow a multilayer structure 3 onto the substrate 7 an additional strain compensation layer 8, in this case AlInP is grown onto the Ge layer 24 and the Ge layer 24 is grown onto a SiGe layer 16.

In this case in order to be able to grow the multilayer structure 9 on the substrate 7 it is necessary to reduce the lattice constant of the material of the inactive layer. For the embodiment of FIG. 3 $Al_{0.6}Ga_{0.39}In_{0.01}As_{0.998}N_{0.001}P_{0.001}$ has been chosen.

By use of the SiGe layer 16 between the Si layer 6 and the Ge layer 24 the lattice constant is gradually increased from Si towards Ge, wherein the SiGe layer is relaxed before the Ge layer is grown on top of it. The Ge composition changes over the thickness of the SiGe layer 16. However, the lattice constant does not reach the lattice constant of Ge before the Ge layer is grown. Consequently, there is residual compressive strain left in the Ge layer 24, which is compensated by use of a strain compensation layer 8 of AlInP. AlInP has an even smaller lattice constant than the part of the SiGe layer 16 in contact with Ge layer 24.

To obtain a successful growth of an AlGaAs material on such structure, one needs to reduce the lattice constant of the AlGaAs material of the inactive layer. This can be done by choosing a proper composition of AlGaInAsNP—e.g. one could use $Al_{0.6}Ga_{0.39}In_{0.01}As_{0.949}N_{0.001}P_{0.05}$, where z and c are adjusted to reach the desired lattice constant which is smaller than that of Ge and larger than that of the strain compensation layer 8.

Figure 4:
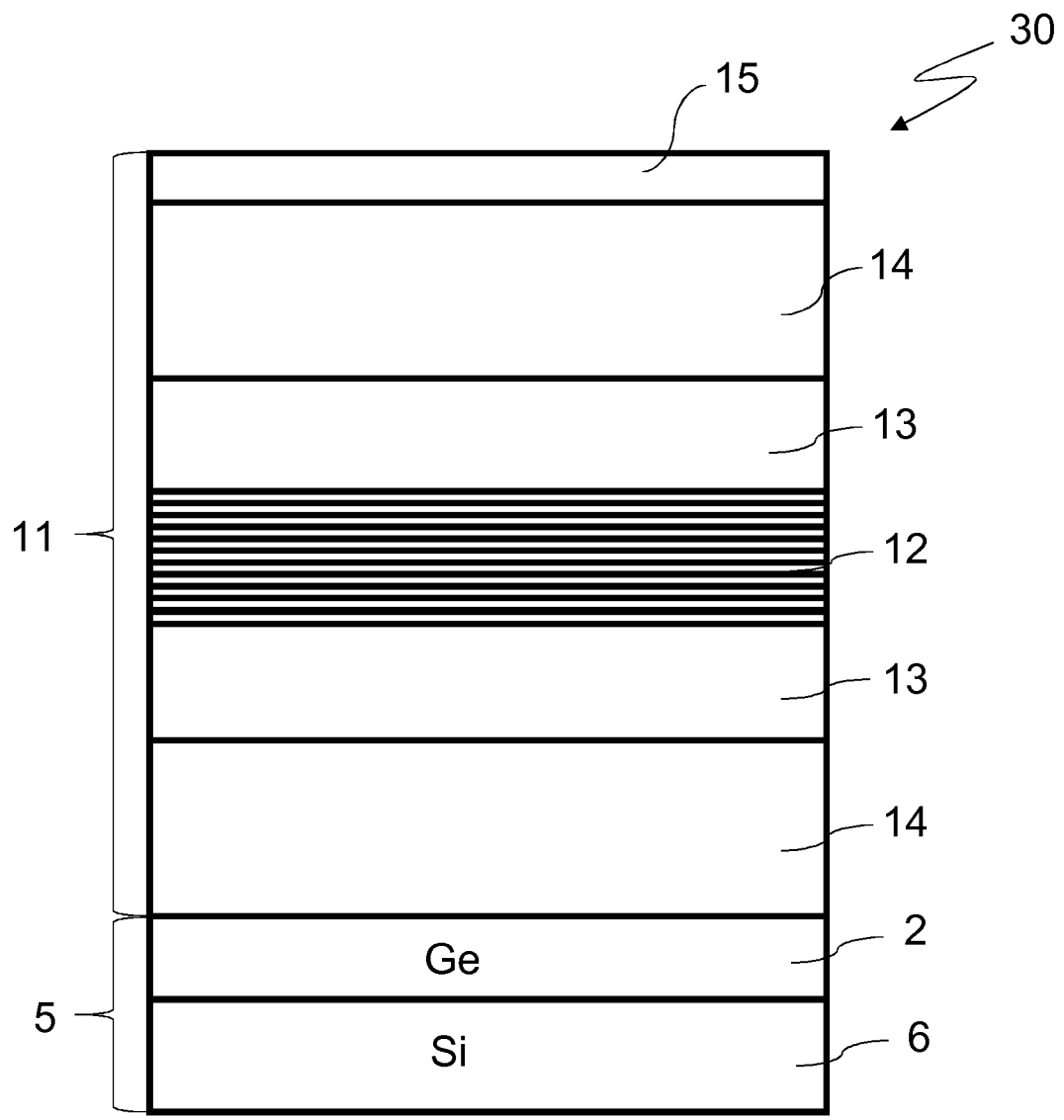
FIG. 4 is a more detailed schematic cross-sectional view of an optoelectronic semiconductor device according to an embodiment of the present disclosure.

FIG. 4 shows a more detailed view of a semiconductor device following the design principles of FIG. 2.

Again the substrate 5 comprises a Si layer 6 and a strain relaxed Ge layer 2, wherein a laser structure 11 is grown onto the substrate 5. In an embodiment not depicted in the figures the Si layer 6 could well be replaced by a Ge layer.

Figure 5:
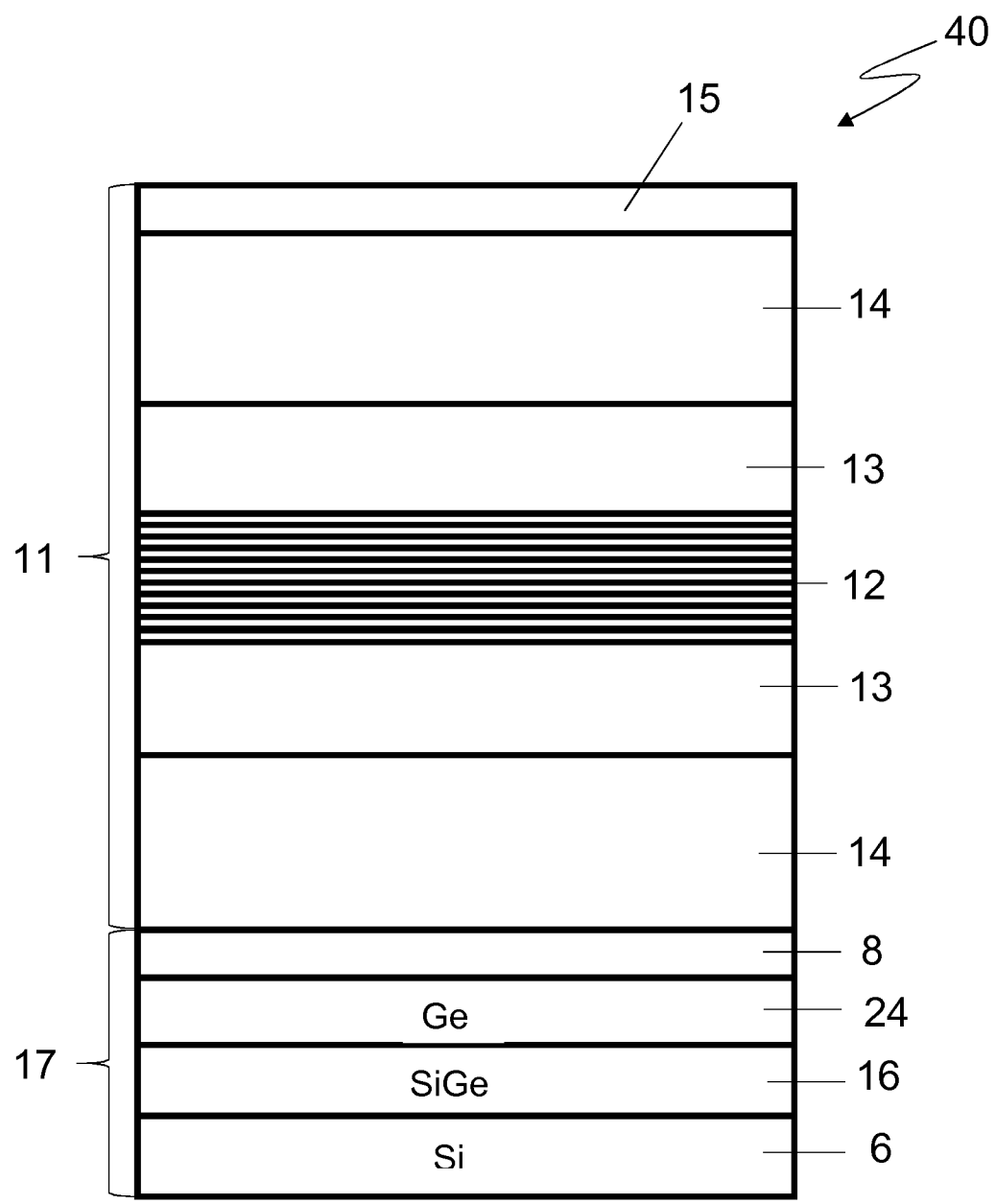
FIG. 5 is detailed schematic cross-sectional view of an optoelectronic semiconductor device according to a further embodiment of the present disclosure.

In the embodiment of FIG. 5 between the Si layer 6 and a strained Ge layer 24, a SiGe layer 16 is located. Furthermore a strain compensation layer 8 is located between the Ge layer 24 and the optoelectronic semiconductor multilayer structure 11. In this embodiment the substrate 17 is formed by the Si layer 6, the SiGe layer 16, the Ge layer 24 and the strain compensation layer 8.

The laser structure 11 of FIGS. 4 and 5 comprises a multiple quantum well structure 12. The multiple quantum well structure 12 has multiple alternating layers of quantum well material and a barrier material. The quantum well material that has smaller bandgap than the barrier material forming a potential well (quantum well) for electrons and holes when inserted between two layers of barrier material. The multiple quantum well structure 12 is formed by one or more quantum wells separated by the barrier material.

The quantum well structure 12 is sandwiched between two waveguide layers 13 both of GaInAs. The functionality of the GaInAs layers 14 is to act as a waveguide and keep the optical field confined in the region of the multi-quantum well structure 12. Those inactive waveguide layers 13 have a considerable thickness of up to 3 μm but still do not lead to any substantial built up of compressive strain in the structure.

In addition the optoelectronic multilayer structure 11 comprises two cladding layers 14 of $Al_{0.6}Ga_{0.4}As$. Further on top of the upper cladding layer 14 there is a contact layer 15.

Figure 6:
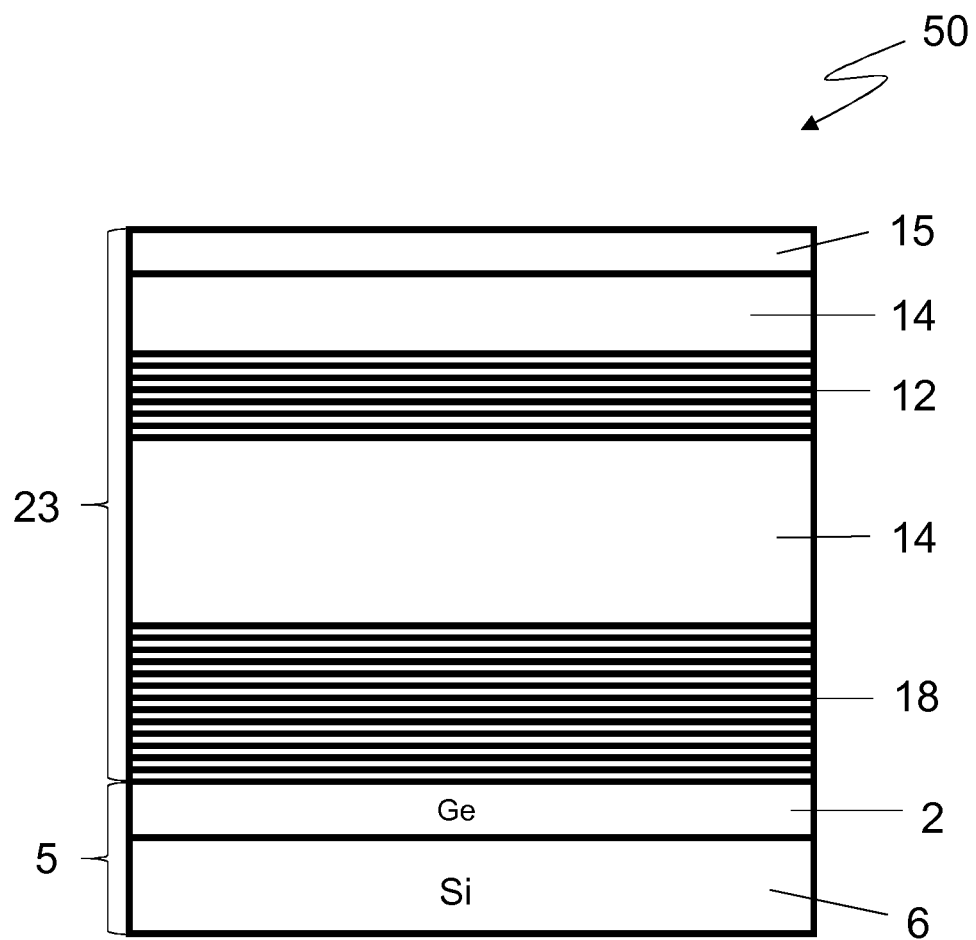
FIG. 6 is a schematic cross-sectional view of yet another embodiment of an optoelectronic semiconductor device according to the present disclosure.

FIG. 6 shows a schematic cross-sectional view of an alternative embodiment of a semiconductor device 40 according to the present disclosure. On a substrate 5 as it has been described with reference to FIGS. 2 and 4 above an optoelectronic semiconductor multilayer structure 23 has been grown.

In addition to a multi-quantum well structure 12 embedded between two cladding layers 14 and an additional contact layer 15 on top of the structure a distributed Bragg reflector 18 has been integrated into the multilayer structure 23. Alternative designs of the substrate 5 as they have been described in detail above could be implemented.

Figure 7:
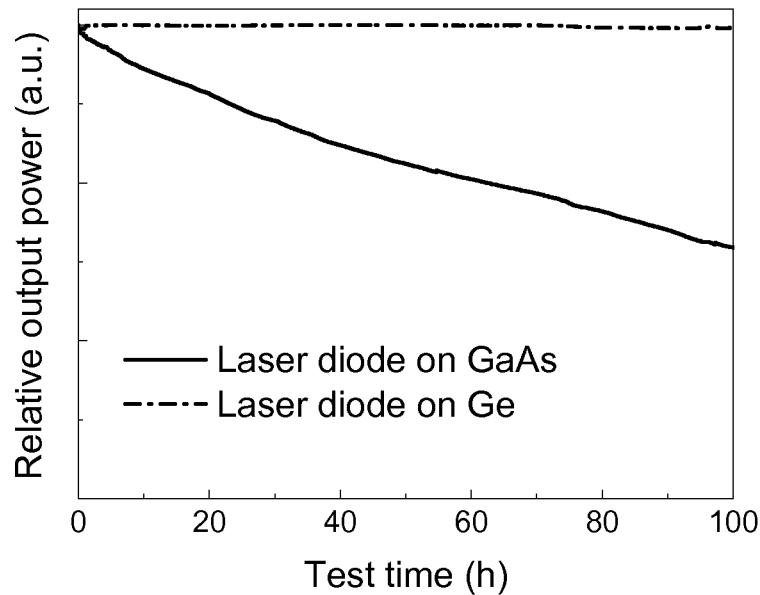
FIG. 7 is a comparative graph representing relative output power over test time.

FIG. 7 is a graph presenting relative output power in arbitrary units over test time in hours. The continuous line in the graph of FIG. 7 represents the output power of a comparative structure, wherein a laser diode has been fabricated on a GaAs substrate. The comparative structure is schematically depicted in FIG. 8b). The relative output power of the comparative structure decreases with increasing test time.

The dashed line in the graph of FIG. 7 represents relative output power of a semiconductor device according to the present disclosure comprising a laser diode structured on a substrate having a Ge layer. The comparative structure is schematically depicted in FIG. 8a). The relative output power of the comparative structure is roughly constant over test time.

FIG. 8c) shows the Band gap of the optoelectronic multilayer structure of the laser diodes according to FIGS. 8a) and b).

Figure 8:
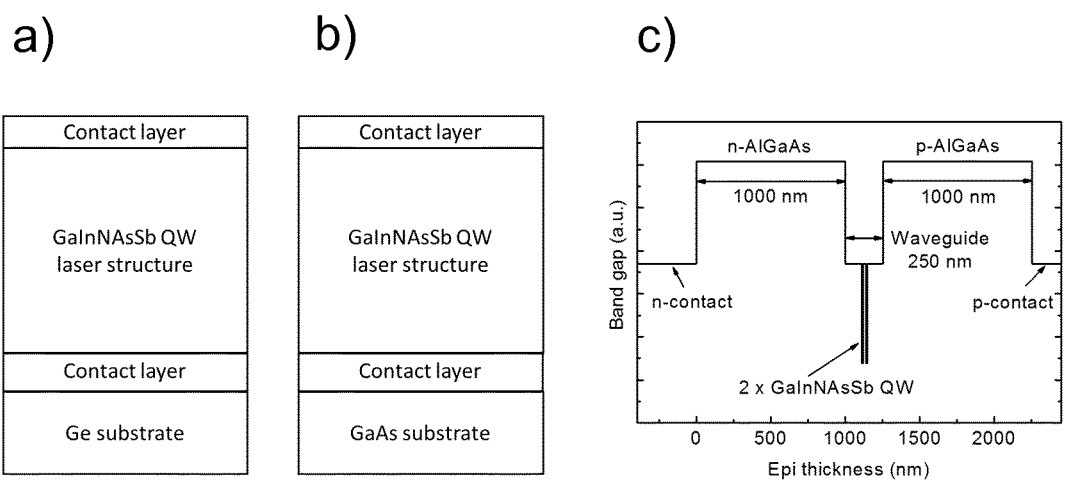
FIG. 8 is a schematic representation of the devices under test of the graph of FIG. 7.
Figure 9:
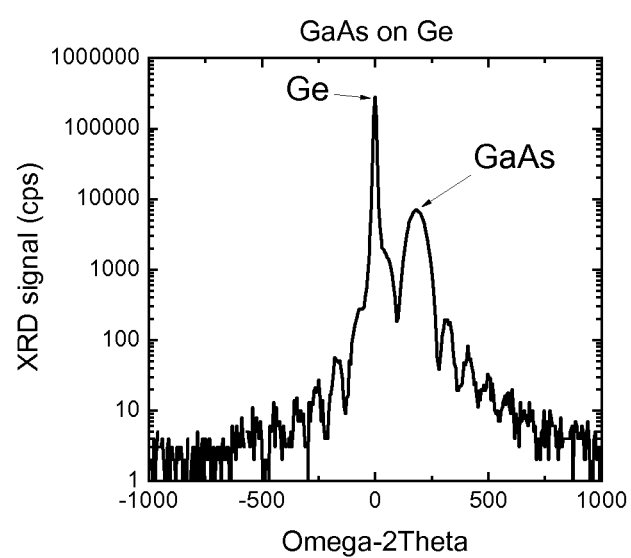
FIG. 9 is a graph representing the X-ray diffraction signal of a GaAs layer on a Ge substrate.

FIG. 9 is a graph plotting the X-ray diffraction signal over the Omega-2Theta angle of a GaAs layer grown on Ge substrate. The difference (in arc sec) of the diffraction peaks is linked to the lattice mismatch between the GaAs and Ge layers. The mismatch of the AlGaAs material-based layers on Ge layer should not exceed this. The strain in of the GaAs layer in the FIG. 8 is tensile meaning that the GaAs peak is on the right side of the Ge peak. However, the strain of the AlGaAs on Ge may also be compressive, in which case its diffraction peak would be on the left side of the Ge peak, but the distance should still be the same or smaller than the distance of the GaAs and Ge peaks.

Figure 10:
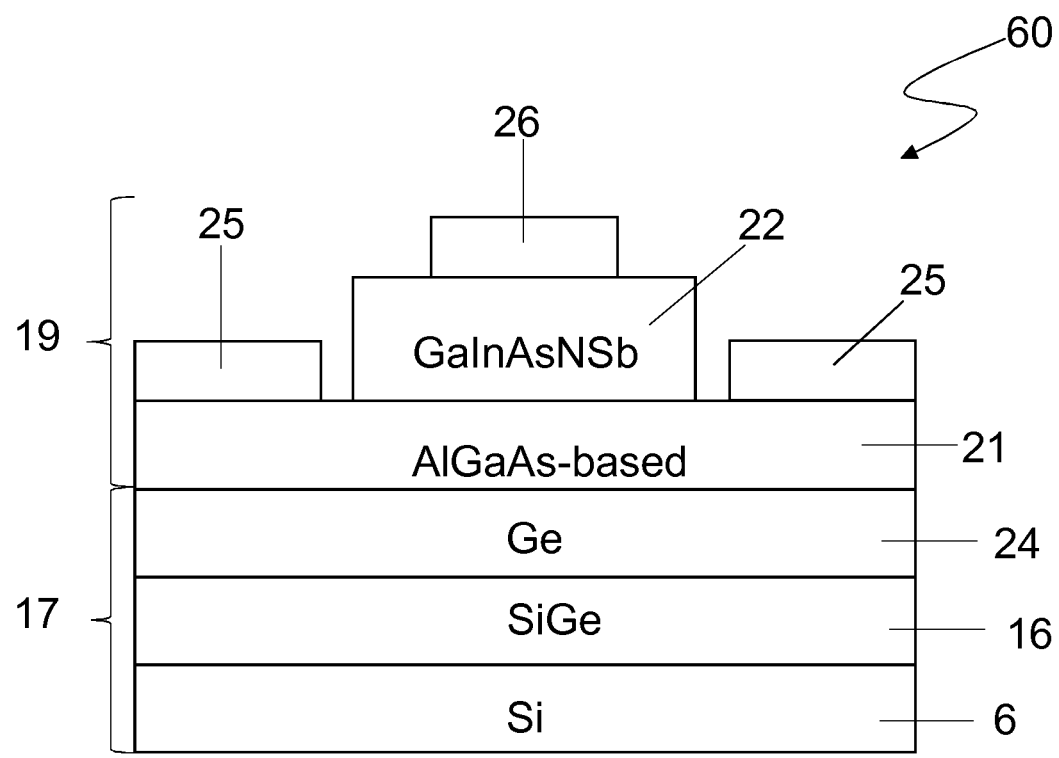
FIG. 10 is a schematic cross-sectional view of a semiconductor device according to the present disclosure, wherein the semiconductor multilayer structure comprises a transistor.

FIG. 10 is a schematic cross-sectional view of a semiconductor device 60 having a microelectronic multilayer semiconductor structure 19 forming a transistor. The substrate 17 is identical to the substrate 17 of FIG. 5. The transistor formed by the semiconductor multilayer structure 19 comprises a layer 21 of an AlGaAs-based material and a layer 22 consisting of AlGaInAsNSb. In order to be able to operate as a transistor the multilayer structure 19 further has contacts 23, 25 acting as the gate, as the drain, and as the source of the transistor, respectively.

In the figures identical elements are denoted by identical reference signs.

For purposes of original disclosure, it is pointed out that all features which are apparent for a person skilled in the art from the present description, the figures and the claims, even if they have only been described with further features, could be combined on their own or together with all the combinations of the features disclosed herein, if not excluded explicitly or technically impossible. A comprehensive explicit description of all possible combinations of features is only omitted in order to provide readability of the description.

While the disclosure has been described with respect to a limited number of embodiments, it will be understood that the disclosure is not limited to those embodiments. Other embodiments comprising various changes do not depart from the scope of the disclosure. In particular, the description of preferred embodiments shall not be understood to be limited to what is explicitly shown and described in the specification and drawings but shall encompass the disclosure of the specification and drawings as a whole.

The invention claimed is:

1. A semiconductor device comprising:
a substrate comprising a layer made of Ge; and
a semiconductor multilayer structure comprising:
at least one first layer comprising a material selected from a group consisting of:
$Al_xGa_{1-x}As$, wherein x is approximately 0.6,
$Al_xGa_{1-x-y}In_yAs$, wherein $0 \leq x \leq 0.6$ and $0 \leq y \leq 0.02$,
$Al_xGa_{1-x-y}In_yAs_{1-z}P_z$, $Al_xGa_{1-x-y}In_yAs_{1-z}N_z$, and $Al_xGa_{1-x-y}In_yAs_{1-z-c}N_zP_c$, wherein $0 \leq x < 1$, $0 \leq y < 1$, $0 \leq z \leq 0.3$, and $0 \leq c < 1$,
$Al_xGa_{1-x-y}In_yAs_{1-z-c}N_zSb_c$, wherein $0 \leq x < 1$, $0 \leq y < 1$, $0 \leq z \leq 0.3$, and $0 \leq c \leq 0.7$, and $Al_xGa_{1-x-y}In_yAs_{1-z-c}P_zSb_c$, wherein $0 \leq x < 1$, $0 \leq y < 1$, $0 \leq z < 1$, and $0 \leq c \leq 0.3$, wherein for any material a sum of the contents of all group-III elements equals 1 and a sum of the contents of all group-V elements equals 1; and at least one second layer comprising a material selected from a group consisting of GaInAsNSb, GaInAsN, AlGaInAsNSb, AlGaInAsN, GaAs, GaInAs, GaInAsSb, GaInNSb, GaInP, GaInPNSb, GaInPSb, GaInPN, AlInP, AlInPNSb, AlInPN, AlInPSb, AlGaInP, AlGaInPNSb, AlGaInPN, AlGaInPSb, GaInAsP, GaInAsPNSb, GaInAsPN, GaInAsPSb, GaAsP, GaAsPNSb, GaAsPN, GaAsPSb, AlGaInAs and AlGaAs, wherein for any material a sum of the contents of all group-III elements equals 1 and a sum of the contents of all group-V elements equals 1;

wherein the semiconductor multilayer structure is grown on the layer made of Ge;

wherein the at least one first layer of the semiconductor multilayer structure has a lattice constant, which differs from a lattice constant of the Ge layer of the substrate by less than a difference between a lattice constant of GaAs and a lattice constant of Ge.

2. The semiconductor device of claim 1, wherein:
the at least one first layer comprises a plurality of first layers;
the at least one second layer comprises a plurality of second layers; and
the semiconductor multilayer structure is an optoelectronic semiconductor multilayer structure comprising:
the plurality of first layers forming inactive layers, and
the plurality of second layers forming active layers.

3. The semiconductor device of claim 2, wherein:
the semiconductor multilayer structure is a heterostructure forming a laser gain structure.

4. The semiconductor device of claim 2, wherein:
the optoelectronic semiconductor multilayer structure comprises a distributed Bragg reflector comprising a plurality of layers of an AlGaAs-based material.

5. The semiconductor device of claim 1, wherein:
the at least one first layer of the semiconductor multilayer structure comprises a $Al_xGa_{1-x}As$ material fulfilling one of the following conditions:
x is approximately 0.6 and the material is $Al_xGa_{1-x}As$;
$0 < x \leq 0.6$ and the material is $Al_xGa_{1-x-y}In_yAs$, wherein $0 < y \leq 0.02$; or
$x > 0.6$ and the material is selected from a group consisting of $Al_xGa_{1-x-y}In_yAs_zP_{1-z}$, $Al_xGa_{1-x-y}In_yAs_{1-z}N_z$, and $Al_xGa_{1-x-y}In_yAs_{1-z-c}N_zP_c$, wherein $0 < y \leq 0.02$, $0 < z \leq 0.3$, and $0 < c < 1$.

6. The semiconductor device of claim 1, wherein:
the substrate comprises at least one additional layer of a material selected from a group consisting of Si, SiGe and Ge.

7. The semiconductor device of claim 6, wherein:
the Ge layer is strain relaxed with respect to the at least one additional layer of the substrate.

8. The semiconductor device of claim 7, wherein:
the Ge layer is compressively strained with respect to the at least one additional layer of the substrate and the substrate further comprises a strain compensation layer; and
the strain compensation layer is grown in direct contact with the Ge layer either between the Ge layer and the semiconductor multilayer structure or between the Ge layer and another layer of the substrate.

9. The semiconductor device of claim 6, wherein:
a microelectronic device is manufactured on the at least one additional layer of the substrate.

10. The semiconductor device of claim 1, wherein:
the semiconductor multilayer structure is a transistor.

* * * * *

UNITED STATES PATENT AND TRADEMARK OFFICE
CERTIFICATE OF CORRECTION

PATENT NO. : 11,688,996 B2
APPLICATION NO. : 16/648171
DATED : June 27, 2023
INVENTOR(S) : Aho et al.

Page 1 of 1

It is certified that error appears in the above-identified patent and that said Letters Patent is hereby corrected as shown below:

In the Claims

Column 8, Line 62, In Claim 1, strike "$\leq$" between "0" and "x" and add "<"

Column 8, Line 62, In Claim 1, strike "$\leq$" between "0" and "y" and add "<"

Column 8, Line 64, In Claim 1, strike "$\leq$" between "0" and "x" and add "<"

Column 8, Line 64, In Claim 1, strike "$\leq$" between "0" and "y" and add "<"

Column 8, Line 65, In Claim 1, strike "$\leq$" between "0" and "z" and add "<"

Column 8, Line 65, In Claim 1, strike "$\leq$" between "0" and "c" and add "<"

Column 8, Line 66, In Claim 1, strike "$\leq$" between "0" and "x" and add "<"

Column 8, Line 66, In Claim 1, strike "$\leq$" between "0" and "y" and add "<"

Column 8, Line 67, In Claim 1, strike "$\leq$" between "0" and "z" and add "<"

Column 8, Line 67, In Claim 1, strike "$\leq$" between "0" and "c" and add "<"

Column 9, Line 1, In Claim 1, strike "$\leq$" between "0" and "x" and add "<"

Column 9, Line 1, In Claim 1, strike "$\leq$" between "0" and "y" and add "<"

Column 9, Line 2, In Claim 1, strike "$\leq$" between "0" and "z" and add "<"

Column 9, Line 2, In Claim 1, strike "$\leq$" between "0" and "c" and add "<"

Signed and Sealed this
Third Day of October, 2023

*Katherine Kelly Vidal*
*Director of the United States Patent and Trademark Office*